(12) United States Patent
Chang et al.

(10) Patent No.: US 7,567,191 B2
(45) Date of Patent: Jul. 28, 2009

(54) ENCODING METHOD AND ENCODER FOR GENERATING BALANCED CODE OR CONSTANT WEIGHTED CODE

(75) Inventors: Chia-Yen Chang, Hsinchu (TW); Hsin-Ping Cheng, Hsinchu (TW)

(73) Assignee: Lite-On It Corp, Taipei (TW)

( * ) Notice: Subject to any disclaimer, the term of this patent is extended or adjusted under 35 U.S.C. 154(b) by 0 days.

(21) Appl. No.: 12/132,756

(22) Filed: Jun. 4, 2008

(65) Prior Publication Data

US 2009/0027244 A1  Jan. 29, 2009

(30) Foreign Application Priority Data

Jul. 27, 2007  (TW)  .............. 96127586 A

(51) Int. Cl.
*H03M 7/00* (2006.01)
(52) U.S. Cl. ........................... 341/106; 341/59
(58) Field of Classification Search ............... 341/50, 341/51, 52, 106, 107, 59; 707/100, 101
See application file for complete search history.

(56) References Cited

U.S. PATENT DOCUMENTS 4,864,303 A * 9/1989 Ofek ........................ 341/95
5,475,388 A * 12/1995 Gormish et al. ............ 341/107
6,002,718 A * 12/1999 Roth .......................... 375/240
6,246,349 B1 * 6/2001 Malik et al. ................ 341/106
6,943,710 B2 * 9/2005 Marpe et al. ............... 341/106

* cited by examiner

*Primary Examiner*—Peguy JeanPierre
(74) *Attorney, Agent, or Firm*—WPAT, PC.; Justin King

(57) ABSTRACT

A method of designing a look-up table of a finite-state encoder, applied to a finite-state encoder, comprises steps of: determining a bit length of a legal output codeword derived from the finite-state encoder and a restrict condition; collecting a plurality of legal output codeword satisfied the restrict condition; determining a bit length of an input codeword derived to the finite-state encoder according to the amount of the plurality of the legal output codeword; determining the amount of states in the finite-state encoder according to the bit length of the input codeword and the bit length of the legal output codeword; dividing the plurality of legal output codeword to a plurality of subset according to the amount of the states in the finite-state encoder and a specific mathematic equation; determining the amount of the legal output codewords in the plurality of subset; and, completing the look-up table through determining a relationship among a present state, a previous state, and a corresponding subset, wherein the amount of the subsets used in the look-up table is greater than the amount of the states in the finite-state encoder and smaller than two times of the amount of the states in the finite-state encoder.

14 Claims, 5 Drawing Sheets

ENCODING METHOD AND ENCODER FOR GENERATING BALANCED CODE OR CONSTANT WEIGHTED CODE

FIELD OF THE INVENTION

The present invention relates to an encoding method and an encoder, and more particularly to an encoding method and an encoder for generating balanced codes or constant weighted codes.

BACKGROUND OF THE INVENTION

Conventionally, data is sequentially recorded in an optical storage system and it is a one-dimension recording system. For increasing the recording capacity or the recording density, the optical storage system uses the optical pickup head having a light source with shorter wavelength and a lens with higher numerical aperture (NA). For example, the blue-ray optical disc system, introduced by SONY, adopts the blue-ray laser beams in the optical disc system, where the blue-ray laser beam has a relatively shorter wavelength than the laser beam of the conventional DVD pickup head. Moreover, the blue-ray optical disc system also adopts a lens having a higher numerical aperture (NA). However, the optical storage system cannot infinitely increase the recording capacity or the recording density through employing light sourced having a shorter wavelength due to a physical limit. Those light beams, having a wavelength shorter than a blue ray, cannot pass through a protecting layer of an optical disc. Moreover, the increasing of the numerical aperture (NA) is also almost approaching the limit of the capability of industry.

The hologram storage system, a new generation optical storage system, has a much higher recording density and transmitting speed than the blue-ray disc. The main reason of the hologram storage system having a higher recording capacity and a higher transmitting speed is: the hologram storage system adopts the 3-dimension optical mode for recording data, and also adopts 2-dimension optical mode for accessing data. Therefore, the efficiency of the data recording and data accessing is much better than the optical storage system in present.

FIG. 1A is a schematic diagram showing a configuration of the hologram storage system used for recording data, wherein the components depicted in dotted lines are not essential when the hologram storage system is used for recording data. Firstly, a light beam having a high spatial and temporal coherence is emitted from a high-power light source 101. The light beam is reflected to another direction after the light beam is emitted to a reflecting component 102, where the reflected light beam is vertical to the incoming light beam in this example. After the light beam is passed through a small hole of a shutter 103, the light beam can serve as an ideal point light source due to a large quantity of the incoming light beam is filtered by the small hole of the shutter 103. The dot-light source is converted to a parallel light beam after the dot-light source is passed a lens 104. The parallel light beam is further divided to two light beams by a splitter 105, where one light beam is called a signal beam 106 due to the storing data will be contained in the signal beam 106, and the other light beam is called a reference beam 107. The signal beam 106 is encoded by a spatial light modulator 108 which serves to convert the digital bit 0 and bit 1 to light pixel and dark pixel, respectively, and these light or dark pixels are arranged to an array format or a page format, where a page is a minimum accessing unit in the hologram storage system. The signal beam 106 is further emitted to and focused on a holographic storage medium 112 via a reflecting component 109 and a lens 111; and the reference beam 107 is also further emitted to and focused on a same spot of the holographic storage medium 112 via a reflecting component 110. An interference pattern (or grating) containing the storing data is generated on the holographic storage medium 112 when the signal beam 106 and the reference beam 107 are simultaneously focused on the same spot of the holographic storage medium 112. Accordingly, the recording processes in the hologram storage system are complete after the interference pattern is recorded.

FIG. 1B is a schematic diagram showing a configuration of the hologram storage system used for reading data, where the components depicted in dotted lines are not essential when the hologram storage system is used for reading data. Firstly, only the reference beam 107 is used to focus on the interference pattern, which is already recorded on the holographic storage medium 112. The interference pattern is then contained in the reference beam 107, and converted to page-format or array-format data after the reference beam 107 is detected by a detecting component 114 via a lens 113.

Same as other in-present optical storage systems, the magnitude variation of signals may decrease the decoding performance in the hologram storage system. In other words, encoder designers prefer to make the amount of the bit 1 as close as possible to the amount of the bit 0 when designing the channel encoding. Through the feature of designing, the DC (direct current) or the low-frequency component in the electric signal will reduce to zero (or a relatively small value).

For approaching the DC or low-frequency component in an electric signal to zero, the U.S. Pat. No. 6,016,330 discloses an encoding method of generating balanced codes. Through the encoding method, the encoded data contains exactly the same amount of bit 1 and bit 0, that is, the amount of the bright pixels and the dark pixels is also exactly the same after the data is encoded by the spatial light modulator. If the light pixel refers to signal level 1 and the dark pixel refers to signal level −1, the average of the signal level of all pixels in the encoded data is much closed to zero. The encoded data can be decoded through the threshold of the light and dark pixel with employing the Viterbi algorithm.

Following is the detail description of the first prior-art encoding method of generating balanced codes (U.S. Pat. No. 6,016,330). The 8-bit input codeword inputted to the encoder is defined as $B_0B_1B_2B_3B_4B_5B_6B_7$, and the 12-bit output codeword derived from the encoder is defined as $b_0b_1b_2b_3b_4b_5b_6b_7b_8b_9b_{10}b_{11}$, where the output codewords are balanced codes. There are 924 legal output codewords if the 12-bit output codeword is restrict to be constituted by six 1's (bit 1) and six 0's (bit 0). The 924 legal codewords are further divided to eight subsets ($S_1 \sim S_8$), and each subset contains 64 unique codewords. Among the 64 codewords, each codeword has at least 4 bits different with the rest codewords, in other words, the minimum Hamming distance in each subset of codewords is 4. Additionally, the subset $S_i$ satisfies the following equation:

$$(b_1+2*b_2+3*b_3+4*b_4+5*b_5+6*b_6+7*b_7+8*b_8+9*b_9+10*b_{10}+11*b_{11}-i) \bmod 12=0$$

FIG. 2 is a block diagram showing a finite-state encoder in the first prior art. Firstly, the 8-bit input codeword 303 is inputted to the encoding circuit 301, and the encoding circuit 301 then determines a present state according to the input codeword 303. The encoding circuit 301 generates a 12-bit legal output codeword 304 according to the input codeword 303, the present state, and a previous state. The legal output codeword 304 is derived from the encoding circuit 301 and the present state is inputted to and stored in the state register

302. The data stored in the state register 302 is referred to the previous state when another input codeword 303 is inputted to the encoding circuit 301. Moreover, there is a look-up table stored in the encoding circuit 301, and with a reference of the look-up table, the encoding circuit 303 can select and output a 12-bit legal output codeword 304 according to the input codeword 303, the present state, and the previous state.

The reason for adopting the finite-state encoder in the first prior art is that the best performance of the maximum-likelihood decoding can be achieved while employing the Viterbi algorithm.

In the first prior-art encoder, the first two bits $B_0B_1$ serves to indicate the four present states: a(00), b(01), c(10), and d(11), accordingly there are four present states and four previous states in the encoder. The last six bits $B_2B_3B_4B_5B_6B_7$ of the 8-bit input codeword serves as an index for indicating a specific legal output codeword in corresponding subsets. For example, if an initial state is a(00) and the first two bits of the 8-bit input codeword is 00, the subset $S_1$ is selected with a reference of the state-to-subset look-up Table 1 due to the initial state a(00) is referred to the previous state and the first two bits of the 8-bit input codeword is referred to the present state a(00). There are 64 legal codewords in the subset $S_1$, and each codeword is with a unique 6-bit index. In this example, the eighth codeword in the subset $S_1$ is selected and will be derived from the encoding circuit 301 if the last six bits of the input codeword is 001000.

TABLE 1

| | Present States | | | |
|---|---|---|---|---|
| Prior States | a(00) | b(01) | c(10) | d(11) |
| a(00) | $S_1$ | $S_2$ | $S_3$ | $S_4$ |
| b(01) | $S_5$ | $S_6$ | $S_7$ | $S_8$ |
| c(10) | $S_2$ | $S_1$ | $S_4$ | $S_3$ |
| d(11) | $S_6$ | $S_5$ | $S_8$ | $S_7$ |

Instead of requiring the amount of 1's and 0's is exactly the same in the balanced code which is employed in the first prior art, the second prior-art encoder (JJAP, Vol 401(2002) pp1763~1766) adopts a constant encoding ratio which is also called pseudo balanced code (or constant weighted code). For example, an encoding ratio 9/12 refers to the input codeword is 9-bit data which is defined as $B_0B_1B_2B_3B_4B_5B_6B_7B_8$ and the output codeword is 12-bit data which is defined as $b_0b_1b_2b_3b_4b_5b_6b_7b_8b_9b_{10}b_{11}$. Moreover, not requiring each legal codeword is restrict to be constituted by six 0's and six 1's, the legal output codeword is flexibly constituted by five 0's and seven 1's, or seven 0's and five 1's in the pseudo balanced code of the second prior art. Accordingly, there are 1584 legal codewords within the 12-bit codewords.

The 1584 legal output codewords are divided to 16 subsets ($S_0 \sim S_{15}$), and the subset $S_i$ satisfies the following equation:

$$(b_1+2*b_2+3*b_3+4*b_4+5*b_5+6*b_6+7*b_7+8*b_8+9*b_9+10*b_{10}+11*b_{11}-i) \bmod 12 = 0$$

Obviously, subsets $S_8 \sim S_{15}$ can be obtained from the subsets $S_0 \sim S_7$ via exchanging 0's to 1's and 1's to 0's in the subsets $S_0 \sim S_7$. As shown in Table 2, the first 3 bits $B_0B_1B_2$ of the input codeword serves to indicates the eight present states: a(000), b(001), c(010), d(011), e(100), f(101), g(110), and h(111); accordingly, there are eight present states and eight previous states in the encoder. The last six bits $B_3B_4B_5B_6B_7B_8$ of the input codeword serves as an index for indicating a specific legal output codeword in a corresponding subset.

TABLE 2

| Previous | Present states | | | | | | | |
|---|---|---|---|---|---|---|---|---|
| States | a(000) | b(001) | c(010) | d(011) | e(100) | f(101) | g(110) | h(111) |
| a(000) | $S_0$ | $S_1$ | $S_2$ | $S_3$ | $S_4$ | $S_5$ | $S_6$ | $S_7$ |
| b(001) | $S_8$ | $S_9$ | $S_{10}$ | $S_{11}$ | $S_{12}$ | $S_{13}$ | $S_{14}$ | $S_{15}$ |
| c(010) | $S_1$ | $S_0$ | $S_3$ | $S_2$ | $S_5$ | $S_4$ | $S_7$ | $S_6$ |
| d(011) | $S_9$ | $S_8$ | $S_{11}$ | $S_{10}$ | $S_{13}$ | $S_{12}$ | $S_{15}$ | $S_{14}$ |
| e(100) | $S_2$ | $S_3$ | $S_0$ | $S_1$ | $S_6$ | $S_7$ | $S_4$ | $S_5$ |
| f(101) | $S_{10}$ | $S_{11}$ | $S_8$ | $S_9$ | $S_{14}$ | $S_{15}$ | $S_{12}$ | $S_{13}$ |
| g(110) | $S_3$ | $S_2$ | $S_1$ | $S_0$ | $S_7$ | $S_6$ | $S_5$ | $S_4$ |
| h(111) | $S_{11}$ | $S_{10}$ | $S_9$ | $S_8$ | $S_{15}$ | $S_{14}$ | $S_{13}$ | $S_{12}$ |

Compared with the first prior-art encoding method (U.S. Pat. No. 6,016,330) for generating the balanced codes, obviously, the second prior-art encoding method (JJAP, Vol 401 (2002) pp 1763~1766) for generating the pseudo balanced code has more flexibility. In the first prior-art encoding method, the amount of 1's and 0's in each legal output codeword is restrict to the same. In the second prior-art encoder, the amount of 1's and 0's in each legal output codeword is only restrict to a specific ratio, but the amount of 1's and 0's in a plurality of output codewords is still restrict to the same. The decoding rate of the input/output codewords has a better performance in the second prior-art encoder, which employs the pseudo balanced code; accordingly, the recording density, or the recording capacity is also increased.

The present invention discloses an encoder having a better performance than the first prior-art and the second prior-art encoder under a same restriction (output codeword is restricted to a balanced code or a pseudo balanced code).

SUMMARY OF THE INVENTION

Therefore, the present invention is related to an encoding method and an encoder through employing a relatively small amount of states.

The present invention provides a method of designing a look-up table of a finite-state encoder, applied to a finite-state encoder, comprising steps of: determining a bit length of a legal output codeword derived from the finite-state encoder and a restrict condition; collecting a plurality of legal output codeword satisfied the restrict condition; determining a bit length of an input codeword derived to the finite-state encoder according to the amount of the plurality of the legal output codeword; determining the amount of states in the finite-state encoder according to the bit length of the input codeword and the bit length of the legal output codeword; dividing the plurality of legal output codeword to a plurality of subset according to the amount of the states in the finite-state encoder and a specific mathematic equation; determining the amount of the legal output codewords in the plurality of subset; and, completing the look-up table through determining a relationship among a present state, a previous state, and a corresponding subset, wherein the amount of the subsets used in the look-up table is greater than the amount of the states in the finite-state encoder and smaller than two times of the amount of the states in the finite-state encoder.

Furthermore, the present invention provides a finite-state encoder, applied to a hologram storage system, comprising: a first read-only memory for storing a plurality of subjects, wherein each subject contains a plurality of legal output codewords; a second read-only memory for storing a state-to-subject look-up table, wherein the state-to-subject look-up table includes a plurality of states and a plurality of subjects, and the amount of the subjects is greater than the amount of the states and smaller than two times of the amount of the states, and the state-to-subject look-up table is complete through employing a minimum number of subjects under a condition of the look-up table is necessary to be capable of converging a corresponding Trellis diagram; a register for storing a state variable in a previous encoding procedure; and, an encoding circuit for selecting a legal output codeword with a specific bit length from the first read-only memory and with a reference of the look-up table stored in the second read-only memory according to an input codeword with a specific bit length and the state variable stored in the register.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The first main characteristic in the present invention is: the subsets in the first two rows of the state-to-subset look-up table are not necessary to be completely different. In the state-to-subset look-up table (Table 1) of the first prior-art encoder, there are eight different subsets $S_0 \sim S_7$ in the first two rows. However, only 6 or 7 subsets are sufficiently required to make a corresponding Trellis diagram with 4 states (FIG. 3) converge to a specific value. Similarly, in the state-to-subset look-up table (Table 2) of the second prior-art encoder, there are 16 different subsets $S_0 \sim S_{15}$ in the first two rows. However, only 12~15 subsets are sufficiently required to make a corresponding Trellis diagram with 8 states (FIG. 4) converge to a specific value. Therefore, through employing a relatively small amount of subsets, the amount of memories required in the present invention is accordingly reduced.

The second main characteristic in the present invention is: the present invention adopts a different equation for generating legal output codewords having a relatively small bit length. The subset $S_i$ in the first and second prior-art encoders satisfies the equation:

$$(b_1+2*b_2+3*b_3+4*b_4+5*b_5+6*b_6+7*b_7+8*b_8+9*b_9+10*b_{10}+11*b_{10}-i) \bmod 12=0$$

However, the first bit $b_0$ of the legal output codeword is independent of the determining of the subset $S_i$. Therefore, the equation for obtaining the subset $S_i$ can be modified to:

$$(b_0+2*b_1+3*b_2+4*b_3+5*b_4+6*b_5+7*b_6+8*b_7+9*b_8+10*b_9+11*b_{10}-i) \bmod 12=0$$

Obviously, the bit length of the legal output codeword is reduced from 12 to 11, and the performance of making use of the legal codewords is accordingly enhanced.

Figure 5:
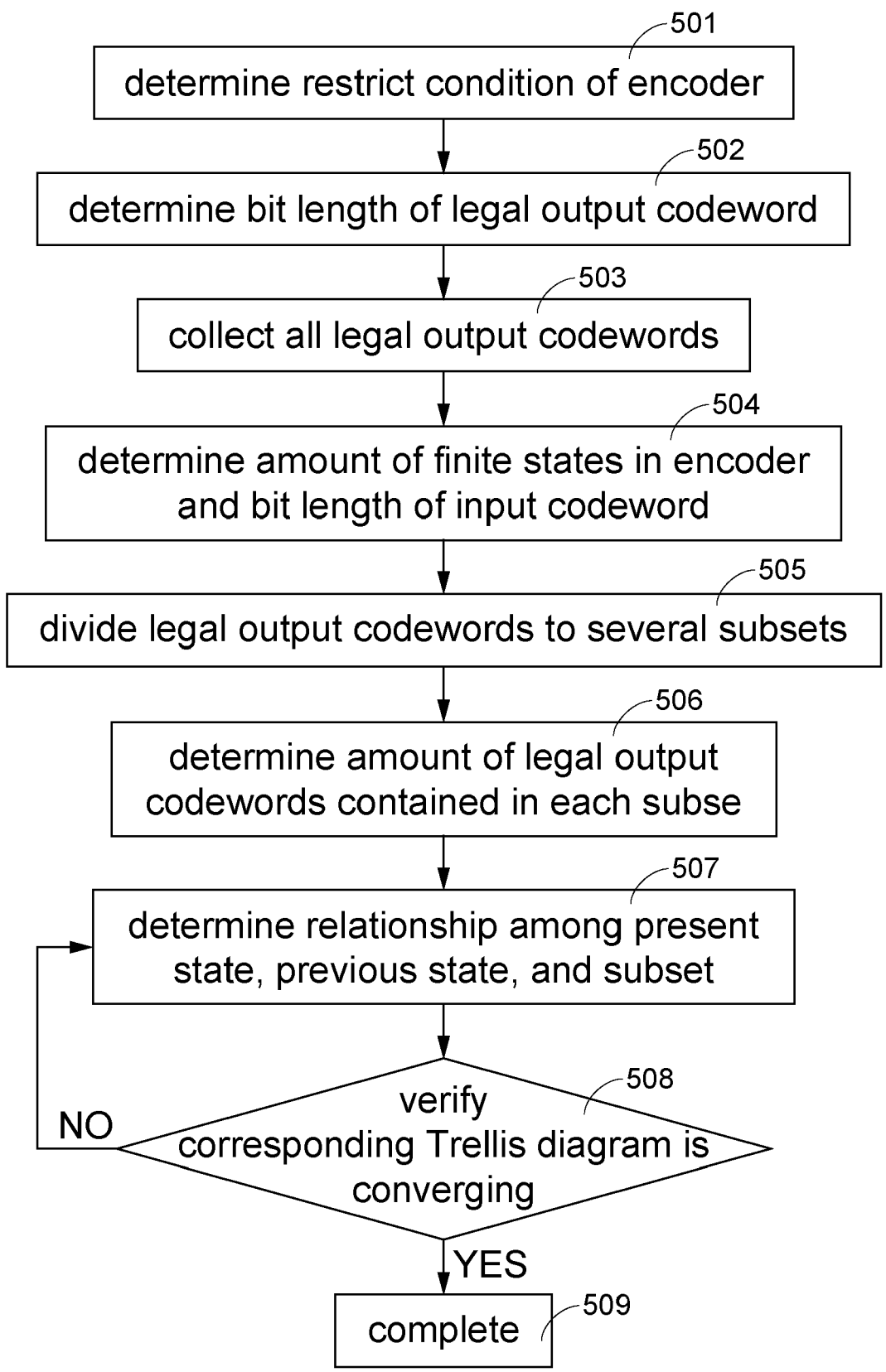
FIG. 5 is a flow chart showing the steps of designing a state-to-subset look-up table for a finite-state encoder in the present invention.

According to the above-mentioned characteristics, the present invention provides a design method of a state-to-subset look-up table, which can be applied to a finite-state encoder. FIG. 5 is a flow chart showing the steps of designing a state-to-subset look-up table for a finite-state encoder in the present invention. The method comprises steps of: determining a restrict condition of the encoder (step 501), where the restrict condition is for restricting the encoder to employ a balanced code or a constant weighted code; determining the bit length of a legal output codeword (step 502); collecting all legal output codewords (satisfy the balance code or the constant weighted code with a determined bit length) through a specific computer program (step 503), where the amount of the legal output codewords is related to the determining of the bit length of the input codeword; determining the amount of finite states in the encoder and determining the bit length of the input codeword after all legal output codewords are obtained (step 504); dividing these legal output codewords to a plurality of subset according to a specific mathematic equation (step 505), where the amount of the subsets is related to the amount of states in the encoder, for example, 6~7 subsets are required if the amount of the states is four, 12~15 subsets are required if the amount of the states is eight, and the subset $S_i$ in the present invention satisfies the modified equation:

$$(b_1+2*b_2+3*b_3+4*b_4+5*b_5+6*b_6+7*b_7+8*b_8+9*b_9+10*b_{10}+11*b_{11}-i) \bmod 12=0$$

determining the amount of legal output codewords contained in each subset according to the bit length of the input codeword and the amount of states in the encoder (step 506); building a temporary state-to-subset look-up table through a relationship among the present state, previous state, and a corresponding subset, where the relationship can be determined through a specific computer program (step 507), a main characteristic of the state-to-subset look-up table is: the amount of the subsets is determined between one to two times of the amount of the states in the finite-state encoder; verifying the temporary state-to-subset loop-up table is capable of converging a corresponding Trellis diagram to a specific value or not (step 508); completing the state-to-subset loop-up table if the temporary state-to-subset loop-up table is capable of converging the corresponding Trellis diagram to a specific value (step 509), or re-building the relationship among the present state, the previous state, and the corresponding subset (step 507).

Following are 5 embodiments for designing a state-to-subset look-up table and its corresponding encoder (balanced code or constant weighted code).

Figure 1A:
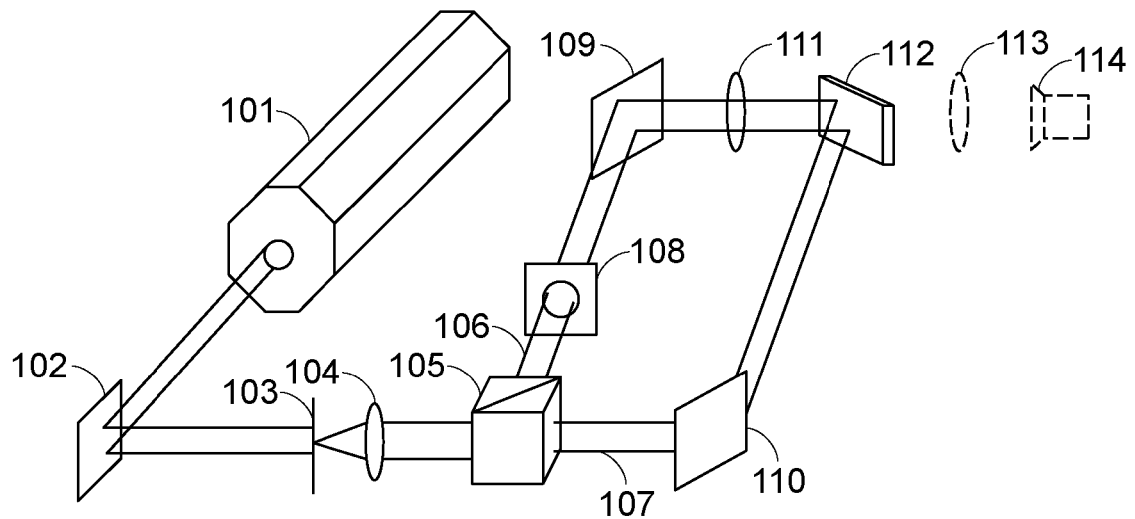
FIG. 1A is a schematic diagram showing a configuration of the hologram storage system used for recording data.
Figure 1B:
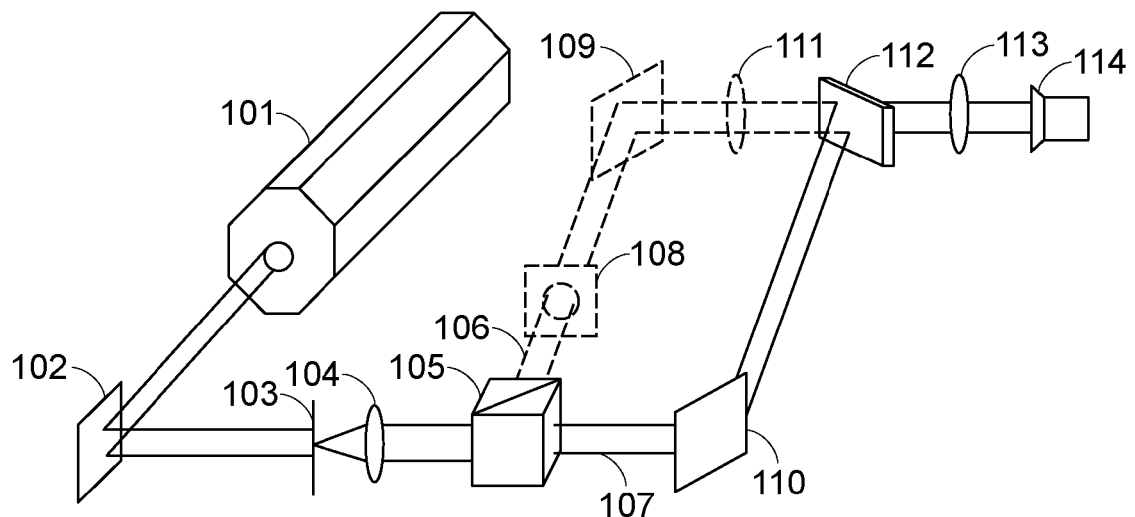
FIG. 1B is a schematic diagram showing a configuration of the hologram storage system used for reading data.
Figure 2:
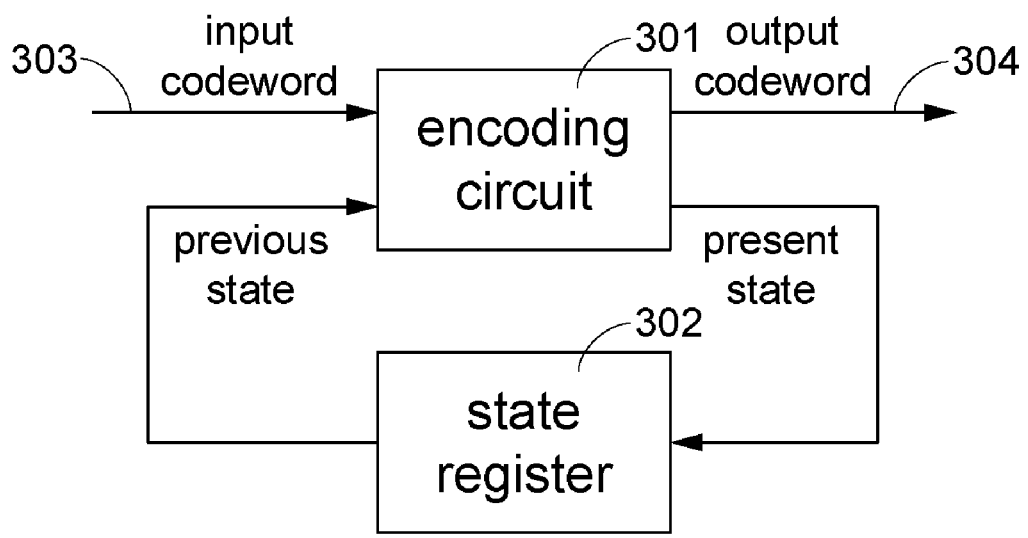
FIG. 2 is a block diagram showing a finite-state encoder in the first prior art.
Figure 3:
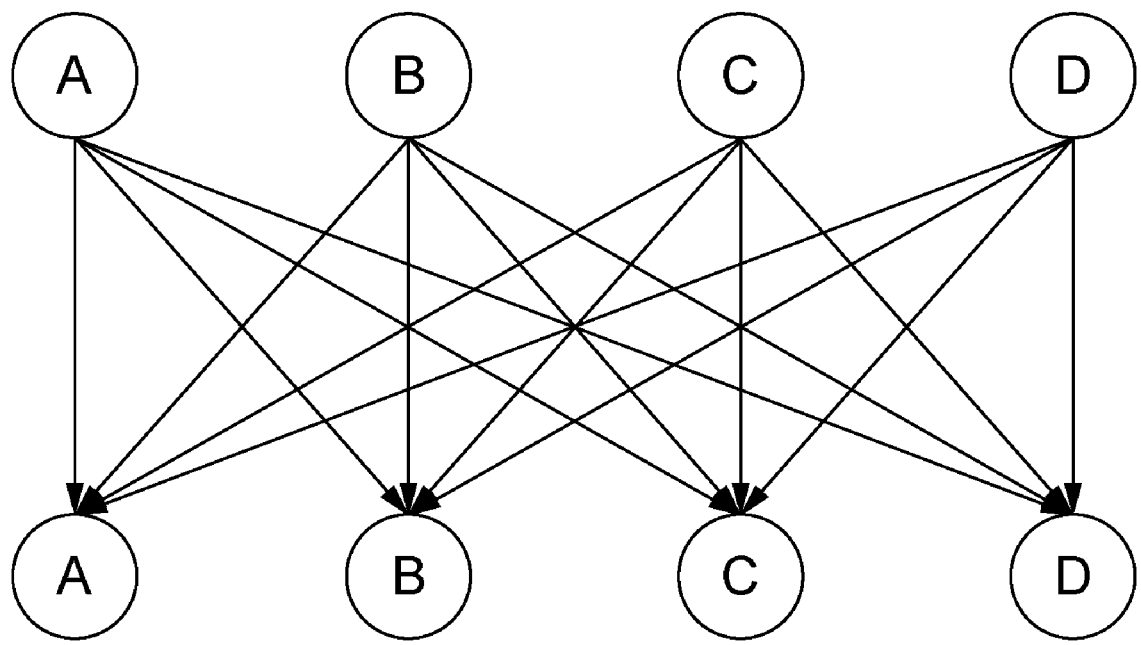
FIG. 3 is a converged Trellis diagram with 4 states.

The first embodiment (constant weighted code with an encoding ratio 4/6). The encoder in the first embodiment of the present invention is restricted to employ the constant weighted code (step 501); the bit length of the output codeword is six according to the encoding ratio 4/6 (step 502); there are 30 legal output codewords if the 6-bit output codeword is restrict to be constituted by two 1's and four 0's, or constituted by two 0's and four 1's (step 503), and the legal output codeword is defined as $b_0b_1b_2b_3b_4b_5$; the bit length of the input codeword is four according to the encoding ratio 4/6, and the input codeword is defined as $B_0B_1B_2B_3$, where the first two bits $B_0B_1$ serves to indicate the four present states: a(00), b(01), c(10), and d(11), accordingly there are four states in the encoder (step 504); a 4×4 state-to-subset look-up table is required in the encoder due to there are four present states and four previous states, and the 4×4 state-to-subset look-up table requires 6~7 subsets, in the embodiment, the 30 different legal output codewords are divided to seven subsets ($S_0$~$S_6$) (step 505); there are four codewords in each subset in the embodiment (step 506), where the codewords in each subset satisfy the requirement (minimum Hamming distance=4), and the seven subsets and their corresponding codewords are:

$S_0$=[000011;011101;101110;110000];
$S_1$=[000101;011110;100010;111001];
$S_2$=[000110;011011;100001;111100];
$S_3$=[001001;010111;100100;111010];
$S_4$=[001010;010001;101101;110110];
$S_5$=[001100;010010;101011;110101];
$S_6$=[001111;010100;101000;110011];

the last two bits $B_2B_3$ of the input codeword serves as an index for indicating a specific legal output codeword in a corresponding subsets, the temporary 4×4 state-to-subset look-up table is built through a specific computer program (step 507); the state-to-subset look-up table is finally complete if the temporary state-to-subset loop-up table is capable of converging a corresponding Trellis diagram to a specific value (step 509) as shown in FIG. 3.

Table 3 is the state-to-subset look-up table designed in the first embodiment of the present invention, where the (m, n, p, q) can be selected from (4,5,5,4) or (4,6,5,6), which has a subset having a relatively high minimum Hamming distance.

TABLE 3

| Previous States | Present States | | | |
|---|---|---|---|---|
| | a(00) | b(01) | c(10) | d(11) |
| a(00) | $S_0$ | $S_1$ | $S_2$ | $S_3$ |
| b(01) | $S_4$ | $S_5$ | $S_m$ | $S_n$ |
| c(10) | $S_1$ | $S_0$ | $S_3$ | $S_2$ |
| d(11) | $S_5$ | $S_4$ | $S_p$ | $S_q$ |

Following is an example for illustrating the steps of selecting a legal output codeword through the Table 3. If the previous state is a(00) and the input codeword inputted to the encoder is $B_0B_1B_2B_3$=1010, the present state is assigned to c(10) due to the first two bits $B_0B_1$ is 10. The subset $S_2$ is selected according to the previous state is a(00) and the present state is c(10). The codeword having an index of 10 in the subset $S_2$ is further selected as the legal output codeword due to the last two bits $B_2B_3$ serves to indicate the index of output codeword in the subset, therefore, the third codeword (100001) in the subset $S_2$ is selected and derived from the encoder.

Figure 4:
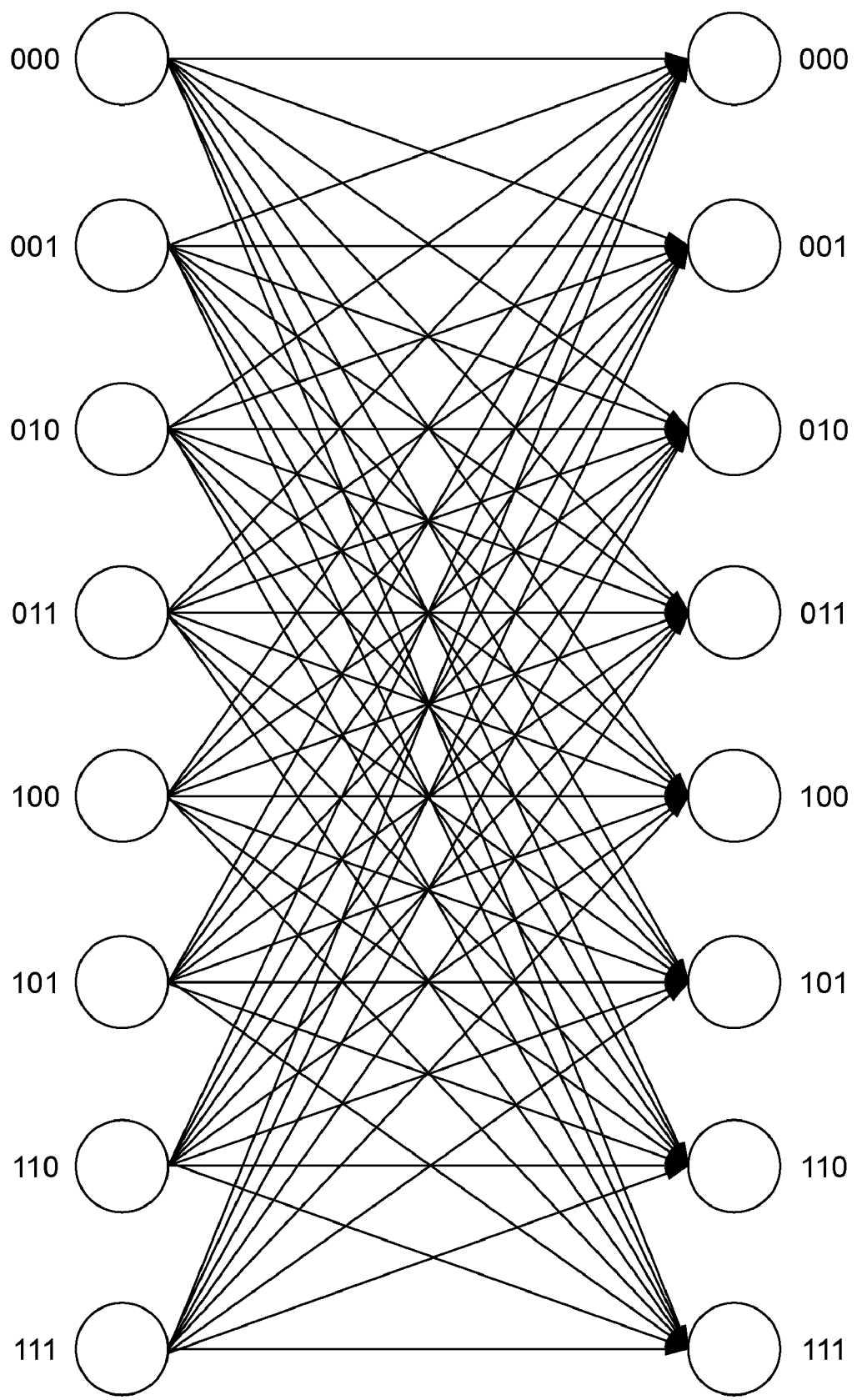
FIG. 4 is a converged Trellis diagram with 8 states.

The second embodiment (constant weighted code with an encoding ratio 8/11). The encoder in the second embodiment of the present invention is restricted to employ the constant weighted code (step 501); the bit length of the output codeword is eleven according to the encoding ratio 8/11 (step 502); there are 462 legal output codewords if the 11-bit output codeword is restrict to be constituted by six 1's and five 0's, or constituted by six 0's and five 1's (step 503), and the legal output codeword is defined as $b_0b_1b_2b_3b_4b_5b_6b_7b_8b_9b_{10}$; the bit length of the input codeword is eight according to the encoding ratio 8/11, and the input codeword is defined as $B_0B_1B_2B_3B_4B_5B_6B_7$, where the first three bits $B_0B_1B_2$ serves to indicate the eight present states: a(000), b(001), c(010), d(011), e(100), f(101), g(110), and h(111) (step 504), accordingly there are eight states in the encoder (step 504); a 8×8 state-to-subset look-up table is required in the encoder due to there are eight present states and eight previous states, and the 8×8 state-to-subset look-up table requires 12~15 subsets, in the embodiment, the 462 different legal output codewords are divided to 12 subsets ($S_0$~$S_{11}$) (step 505); there are 32 codewords in each subset in the embodiment (step 506), where the codewords in each subset satisfy the requirement (minimum Hamming distance=4), and the codeword in the subset $S_i$ satisfies the equation:

$$(b_0+2*b_1+3*b_2+4*b_3+5*b_4+6*b_5+7*b_6+8*b_7+9*b_8+10*b_9+11*b_{10}-i) \bmod 12=0$$

the last five bits $B_3B_4B_5B_6B_7$ of the input codeword serves as an index for indicating a specific legal output codeword in a corresponding subsets, the temporary 8×8 state-to-subset look-up table is built through a specific computer program (step 507); the state-to-subset look-up table is finally complete if the temporary state-to-subset loop-up table is capable of converging a corresponding Trellis diagram to a specific value (step 509) as shown in FIG. 4.

Table 4 is the state-to-subset look-up table designed in the second embodiment of the present invention, where the table is stored in a memory of the encoder.

TABLE 4

| Previous States | Present States | | | | | | | |
|---|---|---|---|---|---|---|---|---|
| | a(000) | b(001) | c(010) | d(011) | e(100) | f(101) | g(110) | h(111) |
| a(000) | $S_0$ | $S_1$ | $S_2$ | $S_3$ | $S_4$ | $S_5$ | $S_6$ | $S_7$ |
| b(001) | $S_8$ | $S_9$ | $S_{10}$ | $S_{11}$ | $S_8$ | $S_9$ | $S_{10}$ | $S_{11}$ |
| c(010) | $S_1$ | $S_0$ | $S_3$ | $S_2$ | $S_5$ | $S_4$ | $S_7$ | $S_6$ |
| d(011) | $S_9$ | $S_8$ | $S_{11}$ | $S_{10}$ | $S_9$ | $S_8$ | $S_{11}$ | $S_{10}$ |
| e(100) | $S_2$ | $S_3$ | $S_0$ | $S_1$ | $S_6$ | $S_7$ | $S_4$ | $S_5$ |
| f(101) | $S_{10}$ | $S_{11}$ | $S_8$ | $S_9$ | $S_{10}$ | $S_{11}$ | $S_8$ | $S_9$ |
| g(110) | $S_3$ | $S_2$ | $S_1$ | $S_0$ | $S_7$ | $S_6$ | $S_5$ | $S_4$ |
| h(111) | $S_{11}$ | $S_{10}$ | $S_9$ | $S_8$ | $S_{11}$ | $S_{10}$ | $S_9$ | $S_8$ |

Following is an example for illustrating the steps of selecting a legal output codeword through the Table 4. If the previous state is f(101) and the input codeword derived to the encoder is $B_0B_1B_2B_3B_4B_5B_6B_7$=0100 1000, the present state is assigned to c(010) due to the first three bits $B_0B_1B_2$ is 010. The subset $S_8$ is selected according to the previous state is f(101) and the present state is c(010). The codeword having an index of 01000 in the subset $S_8$ is further selected as the legal output codeword due to the last five bits $B_3B_4B_5B_6B_7$ serves to indicate the index of output codeword in the subset, therefore, the codeword having an index of 01000 in the subset $S_8$ is selected and derived from the encoder.

The third embodiment (balanced code with an encoding ratio 9/12). The encoder in the third embodiment of the present invention is restricted to employ the balanced code (step 501); the bit length of the output codeword is twelve according to the encoding ratio 9/12 (step 502); there are 924 legal output codewords if the 12-bit output codeword is restrict to be constituted by six 1's and six 0's (step 503), and the legal output codeword is defined as $b_0b_1b_2b_3b_4b_5b_6b_7b_8b_9b_{10}b_{11}$; the bit length of the input codeword is nine according to the encoding ratio 9/12, and the input codeword is defined as $B_0B_1B_2B_3B_4B_5B_6B_7B_8$, where the first three bits $B_0B_1B_2$ serves to indicate the eight present states: a(000), b(001), c(010), d(011), e(100), f(101), g(110), and h(111) (step 504), accordingly there are eight states in the encoder (step 504); a 8×8 state-to-subset look-up table is required in the encoder due to there are eight present states and eight previous states, and the 8×8 state-to-subset look-up table requires 12~15 subsets, in the embodiment, the 924 different legal output codewords are divided to 12 subsets ($S_0$~$S_{11}$) (step 505); there are 64 codewords in each subset in the embodiment (step 506), where the codewords in each subset satisfy the requirement (minimum Hamming distance=4), and the codeword in the subset $S_i$ satisfies the equation:

$$(b_1+2*b_2+3*b_3+4*b_4+5*b_5+6*b_6+7*b_7+8*b_8+9*b_9+10*b_{10}+11*b_{11}-i)\mod 12=0$$

the last six bits $B_3B_4B_5B_6B_7B_8$ of the input codeword serves as an index for indicating a specific legal output codeword in a corresponding subsets, the temporary 8×8 state-to-subset look-up table is built through a specific computer program (step 507); the state-to-subset look-up table is finally complete if the temporary state-to-subset loop-up table is capable of converging a corresponding Trellis diagram to a specific value (step 509) as shown in FIG. 4.

Table 5 is the state-to-subset look-up table designed in the third embodiment of the present invention, where the table is stored in a memory of the encoder.

Following is an example for illustrating the steps of selecting a legal output codeword through the Table 5. If the previous state is f(101) and the input codeword derived to the encoder is $B_0B_1B_2B_3B_4B_5B_6B_7B_8$=0100 10000, the present state is assigned to c(010) due to the first three bits $B_0B_1B_2$ is 010. The subset $S_8$ is selected according to the previous state is f(101) and the present state is c(010). The codeword having an index of 010000 in the subset $S_8$ is further selected as the legal output codeword due to the last six bits $B_3B_4B_5B_6B_7B_8$ serves to indicate the index of output codeword in the subset, therefore, the codeword having an index of 010000 in the subset $S_8$ is selected and derived from the encoder.

The fourth embodiment (constant weighted code with an encoding ratio 9/12). The encoder in the fourth embodiment of the present invention is restricted to employ the constant weighted code (step 501); the bit length of the output codeword is twelve according to the encoding ratio 9/12 (step 502); there are 792 legal output codewords if the 12-bit output codeword is restrict to be constituted by seven 1's and five 0's or five 1's and seven 0's (step 503), and the legal output codeword is defined as $b_0b_1b_2b_3b_4b_5b_6b_7b_8b_9b_{10}b_{11}$; the bit length of the input codeword is nine according to the encoding ratio 9/12, and the input codeword is defined as $B_0B_1B_2B_3B_4B_5B_6B_7B_8$, where the first three bits $B_0B_1B_2$ serves to indicate the eight present states: a(000), b(001), c(010), d(011), e(100), f(101), g(110), and h(111) (step 504), accordingly there are eight states in the encoder (step 504); a 8×8 state-to-subset look-up table is required in the encoder due to there are eight present sates and eight previous states, and the 8×8 state-to-subset look-up table requires 12~15 subsets, in the embodiment, the 792 different legal output codewords are divided to 12 subsets ($S_0$~$S_{11}$) (step 505); there are 64 codewords in each subset in the embodiment (step 506), where the codewords in each subset satisfy the requirement (minimum Hamming distance=4), and the codeword in the subset $S_i$ satisfies the equation:

$$(b_1+2*b_2+3*b_3+4*b_4+5*b_5+6*b_6+7*b_7+8*b_8+9*b_9+10*b_{10}+11*b_{11}-i)\mod 12=0$$

the last six bits $B_3B_4B_5B_6B_7B_8$ of the input codeword serves as an index for indicating a specific legal output codeword in a corresponding subsets, the temporary 8×8 state-to-subset look-up table is built through a specific computer program (step 507); the state-to-subset look-up table is finally complete if the temporary state-to-subset loop-up table is capable of converging a corresponding Trellis diagram to a specific value (step 509) as shown in FIG. 4.

Table 6 is the state-to-subset look-up table designed in the fourth embodiment of the present invention, where the table is stored in a memory of the encoder.

TABLE 5

| Previous States | Present States | | | | | | | |
| --- | --- | --- | --- | --- | --- | --- | --- | --- |
| | a(000) | b(001) | c(010) | d(011) | e(100) | f(101) | g(110) | h(111) |
| a(000) | $S_0$ | $S_1$ | $S_2$ | $S_3$ | $S_4$ | $S_5$ | $S_6$ | $S_7$ |
| b(001) | $S_8$ | $S_9$ | $S_{10}$ | $S_{11}$ | $S_8$ | $S_9$ | $S_{10}$ | $S_{11}$ |
| c(010) | $S_1$ | $S_0$ | $S_3$ | $S_2$ | $S_5$ | $S_4$ | $S_7$ | $S_6$ |
| d(011) | $S_9$ | $S_8$ | $S_{11}$ | $S_{10}$ | $S_9$ | $S_8$ | $S_{11}$ | $S_{10}$ |
| e(100) | $S_2$ | $S_3$ | $S_0$ | $S_1$ | $S_6$ | $S_7$ | $S_4$ | $S_5$ |
| f(101) | $S_{10}$ | $S_{11}$ | $S_8$ | $S_9$ | $S_{10}$ | $S_{11}$ | $S_8$ | $S_9$ |
| g(110) | $S_3$ | $S_2$ | $S_1$ | $S_0$ | $S_7$ | $S_6$ | $S_5$ | $S_4$ |
| h(111) | $S_{11}$ | $S_{10}$ | $S_9$ | $S_8$ | $S_{11}$ | $S_{10}$ | $S_9$ | $S_8$ |

TABLE 6

| Previous States | Present States | | | | | | | |
|---|---|---|---|---|---|---|---|---|
| | a(000) | b(001) | c(010) | d(011) | e(100) | f(101) | g(110) | h(111) |
| a(000) | $S_0$ | $S_1$ | $S_2$ | $S_3$ | $S_4$ | $S_5$ | $S_6$ | $S_7$ |
| b(001) | $S_8$ | $S_9$ | $S_{10}$ | $S_{11}$ | $S_8$ | $S_9$ | $S_{10}$ | $S_{11}$ |
| c(010) | $S_1$ | $S_0$ | $S_3$ | $S_2$ | $S_5$ | $S_4$ | $S_7$ | $S_6$ |
| d(011) | $S_9$ | $S_8$ | $S_{11}$ | $S_{10}$ | $S_9$ | $S_8$ | $S_{11}$ | $S_{10}$ |
| e(100) | $S_2$ | $S_3$ | $S_0$ | $S_1$ | $S_6$ | $S_7$ | $S_4$ | $S_5$ |
| f(101) | $S_{10}$ | $S_{11}$ | $S_8$ | $S_9$ | $S_{10}$ | $S_{11}$ | $S_8$ | $S_9$ |
| g(110) | $S_3$ | $S_2$ | $S_1$ | $S_0$ | $S_7$ | $S_6$ | $S_5$ | $S_4$ |
| h(111) | $S_{11}$ | $S_{10}$ | $S_9$ | $S_8$ | $S_{11}$ | $S_{10}$ | $S_9$ | $S_8$ |

Following is an example for illustrating the steps of selecting a legal output codeword through the Table 6. If the previous state is f(101) and the input codeword derived to the encoder is $B_0B_1B_2B_3B_4B_5B_6B_7B_8$=0100 10000, the present state is assigned to c(010) due to the first three bits $B_0B_1B_2$ is 010. The subset $S_8$ is selected according to the previous state is f(101) and the present state is c(010). The codeword having an index of 010000 in the subset $S_8$ is further selected as the legal output codeword due to the last six bits $B_3B_4B_5B_6B_7B_8$ serves to indicate the index of output codeword in the subset, therefore, the codeword having an index of 010000 in the subset $S_8$ is selected and derived from the encoder.

The fifth embodiment (balanced code with an encoding ratio 8/12). The encoder in the fifth embodiment of the present invention is restricted to employ the balanced code (step 501); the bit length of the output codeword is twelve according to the encoding ratio 8/12 (step 502); there are 924 legal output codewords if the 12-bit output codeword is restrict to be constituted by six 1's and six 0's (step 503), and the legal output codeword is defined as $b_0b_1b_2b_3b_4b_5b_6b_7b_8b_9b_{10}b_{11}$; the bit length of the input codeword is eight according to the encoding ratio 8/12, and the input codeword is defined as $B_0B_1B_2B_3B_4B_5B_6B_7$, where the first two bits $B_0B_1$ serves to indicate the four present states: a(00), b(01), c(10), and d(11) (step 504), accordingly there are four states in the encoder (step 504); a 4×4 state-to-subset look-up table is required in the encoder due to there are four present states and four previous states, and the 4×4 state-to-subset look-up table requires 6~7 subsets, however, these 924 different legal output codewords are divided to twelve subsets $S_0$~$S_{11}$ in the embodiment same as the first prior-art encoder (step 505), and the codeword in the subset $S_i$ satisfies the equation:

$$(b_1+2*b_2+3*b_3+4*b_4+5*b_5+6*b_6+7*b_7+8*b_8+9*b_9+10*b_{10}+11*b_{11}-i) \bmod 12=0$$

Because the amount of the subsets is twelve, which is double to the minimum requirement, the embodiment can have two state-to-subject look-up tables, one is built from 6 subsets and the other one is built from the rest six subsets. The error rate, compared with the first prior-art encoder, is significantly improved since each legal output codeword can be selected from two different look-up table. The last six bits $B_2B_3B_4B_5B_6B_7$ of the input codeword serves as an index for indicating a specific legal output codeword in a corresponding subsets, the two temporary 4×4 state-to-subset look-up table are built through a specific computer program (step 507); the two state-to-subset look-up tables are finally complete if the two temporary state-to-subset loop-up tables are capable of converging a corresponding Trellis diagram to a specific value (step 509) as shown in FIG. 3.

Table 7 and Table 8 are the two look-up tables designed in the fifth embodiment of the present invention.

TABLE 7

| Previous States | Present States | | | |
|---|---|---|---|---|
| | a(00) | b(01) | c(10) | d(11) |
| a(00) | $S_0$ | $S_1$ | $S_2$ | $S_3$ |
| b(01) | $S_4$ | $S_5$ | $S_4$ | $S_5$ |
| c(10) | $S_1$ | $S_0$ | $S_3$ | $S_2$ |
| d(11) | $S_5$ | $S_4$ | $S_5$ | $S_4$ |

TABLE 8

| Previous State | Present States | | | |
|---|---|---|---|---|
| | a(00) | b(01) | c(10) | d(11) |
| a(00) | $S_{11}$ | $S_{10}$ | $S_9$ | $S_8$ |
| b(01) | $S_7$ | $S_6$ | $S_7$ | $S_6$ |
| c(10) | $S_{10}$ | $S_{11}$ | $S_8$ | $S_9$ |
| d(11) | $S_6$ | $S_7$ | $S_6$ | $S_7$ |

Following is an example for illustrating the steps of selecting a legal output codeword through the Table 7 and Table 8. If the previous state is a(00) and the input codeword derived to the encoder is $B_0B_1B_2B_3B_4B_5B_6B_7$=1000 1000, the present state is assigned to c(10) due to the first two bits $B_0B_1$ is 10. The subset $S_2$ or $S_9$ is respectively selected from Table 7 and Table 8 according to the previous state is a(00) and the present state is c(10). The codeword having an index of 001000 in the subset $S_2$ or subset $S_9$ is further selected as the legal output codeword due to the last six bits $B_2B_3B_4B_5B_6B_7$ is 00 1000, where the selected codeword has a better channel characteristic.

Figure 6:
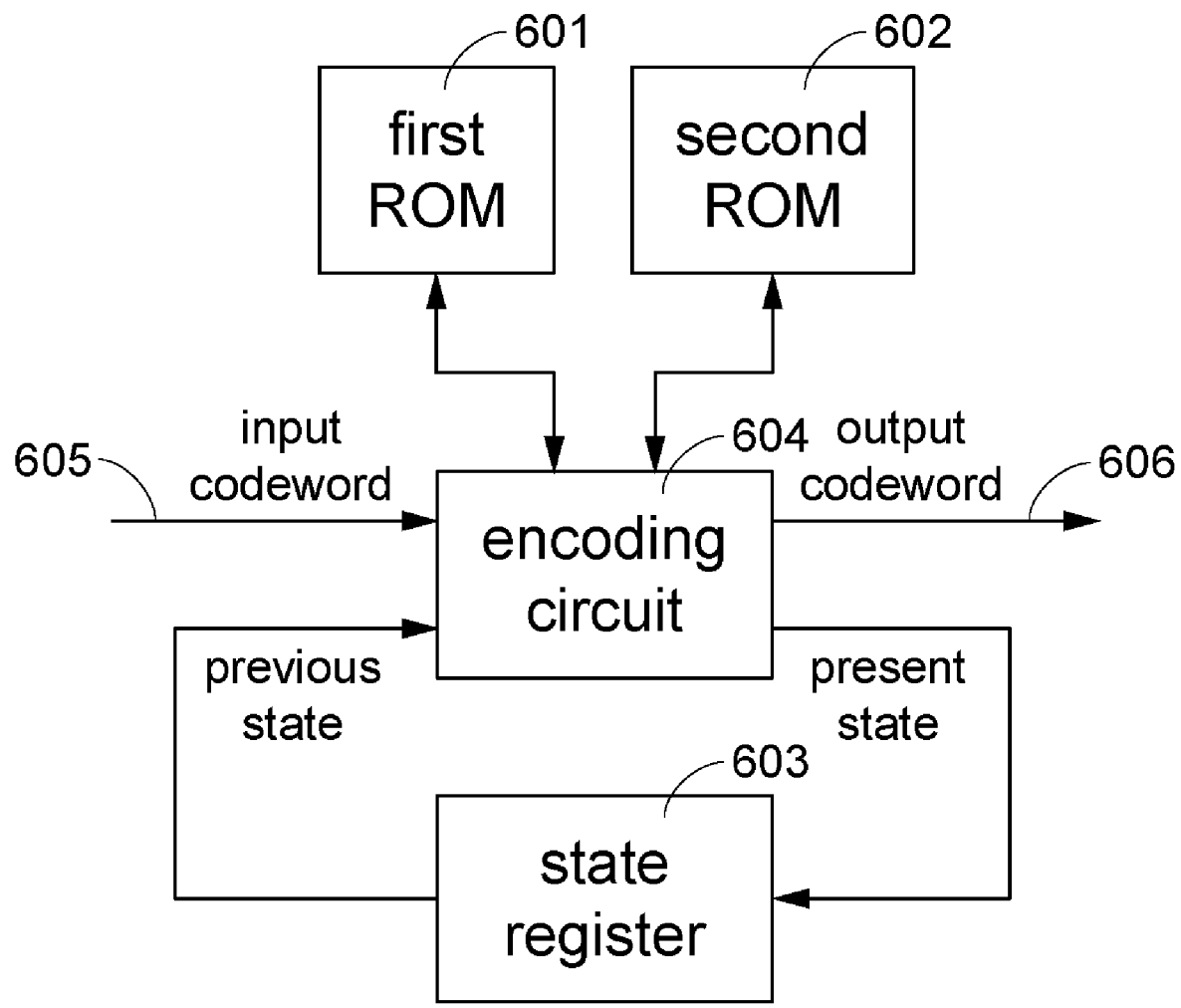
FIG. 6 is a block diagram showing the configuration of the encoder of the present invention.

FIG. 6 is a block diagram showing the configuration of the encoder of the present invention, where the above-mentioned embodiments of the present invention can be implemented by the encoder. The encoder comprises: a first ROM 601 (Read-Only Memory), for storing a plurality of legal output codewords which are divided to a specific amount of subsets; a second ROM 602, for storing a state-to-subset look-up table; a state register 603, for storing a previous state; and an encoding circuit 604, for selecting a legal output codeword with a specific bit length from the first ROM 601 with a reference of the second ROM 602 according to an input codeword with a specific bit length and the previous state stored in the register 603.

In other words, when the input codeword 605 is inputted to the encoding circuit 604, the encoding circuit 604 can determine a present state according to some specific bits within the input codeword 605. The encoding circuit 604 then selects a specific subset with a reference of the state-to-subset table which is stored in the ROM 602 according to the present state and the previous state which is stored in the state register 603. The encoding circuit 604 then further selects a legal output codeword with a specific bit length from the selected subject stored in the ROM 601 according to some specific bits within the input codeword. The present state is then stored in the state register 603, and serves as the previous state when the input codeword 605 is derived to the encoding circuit 604 next time.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of designing a look-up table of a finite-state encoder, applied to a finite-state encoder, comprising steps of:
    determining a bit length of a legal output codeword derived from the finite-state encoder and a restrict condition;
    collecting a plurality of legal output codeword satisfied the restrict condition;
    determining a bit length of an input codeword derived to the finite-state encoder according to the amount of the plurality of the legal output codeword;
    determining the amount of states in the finite-state encoder according to the bit length of the input codeword and the bit length of the legal output codeword;
    dividing the plurality of legal output codeword to a plurality of subset according to the amount of the states in the finite-state encoder and a specific mathematic equation;
    determining the amount of the legal output codewords in the plurality of subset; and
    completing the look-up table through determining a relationship among a present state, a previous state, and a corresponding subset, wherein the amount of the subsets used in the look-up table is greater than the amount of the states in the finite-state encoder and smaller than two times of the amount of the states in the finite-state encoder.

2. The method according to claim 1, wherein the restrict condition is that the amount of bit 1 and bit 0 is the same in each legal output codeword.

3. The method according to claim 1, wherein the restrict condition is that the ratio of the amount of bit 1 to bit 0 is a constant in each legal output codeword, and the constant is not 1.

4. The method according to claim 1, wherein the minimum Hamming distance of the legal output codewords belonging to a same subset is equal or greater than a natural number.

5. The method according to claim 1, wherein the amount of stats in the finite-state encoder is four.

6. The method according to claim 1, wherein the amount of stats in the finite-state encoder is eight.

7. The method according to claim 1, wherein the mathematic equation is a function of specific bits in the input codeword.

8. The method according to claim 1, wherein the relationship among the present state, the previous state, and the corresponding subject is determined through employing a minimum amount of subjects under a condition of a corresponding Trellis diagram is converging.

9. A finite-state encoder, applied to a hologram storage system, comprising:
    a first read-only memory for storing a plurality of subjects, wherein each subject contains a plurality of legal output codewords;
    a second read-only memory for storing a state-to-subject look-up table, wherein the state-to-subject look-up table includes a plurality of states and a plurality of subjects, and the amount of the subjects is greater than the amount of the states and smaller than two times of the amount of the states, and the state-to-subject look-up table is complete through employing a minimum number of subjects under a condition of the look-up table is necessary to be capable of converging a corresponding Trellis diagram;
    a register for storing a state variable in a previous encoding procedure; and
    an encoding circuit for selecting a legal output codeword with a specific bit length from the first read-only memory and with a reference of the look-up table stored in the second read-only memory according to an input codeword with a specific bit length and the state variable stored in the register.

10. The finite-state encoder according to claim 9, wherein the amount of bit 1 and bit 0 is the same in each legal output codeword.

11. The finite-state encoder according to claim 9, wherein the ratio of the amount of bit 1 to bit 0 is a constant in each legal output codeword, and the constant is not 1.

12. The finite-state encoder according to claim 9, wherein the minimum Hamming distance of the legal output codewords belonging to a same subset is equal or greater than a natural number.

13. A finite-state encoder according to claim 9, wherein the amount of stats in the finite-state encoder is four.

14. A finite-state encoder according to claim 9, wherein the amount of stats sin the finite-state encoder is eight.

* * * * *